United States Patent [19]

Isogai

[11] 4,349,895
[45] Sep. 14, 1982

[54] DECODER CIRCUIT OF A SEMICONDUCTOR MEMORY DEVICE

[75] Inventor: Hideaki Isogai, Inagi, Japan

[73] Assignee: Fujitsu Limited, Kawasaki, Japan

[21] Appl. No.: 141,932

[22] Filed: Apr. 21, 1980

[30] Foreign Application Priority Data

Apr. 26, 1979 [JP] Japan ................................ 54/51722

[51] Int. Cl.³ .......................................... G11C 11/40
[52] U.S. Cl. ............................... 365/230; 365/242
[58] Field of Search ............................. 365/242, 230

[56] References Cited

U.S. PATENT DOCUMENTS 3,624,620  11/1971  Andrews ........................... 365/230
3,824,564   7/1974  Wegener ........................... 365/230

Primary Examiner—Vincent P. Canney
Attorney, Agent, or Firm—Staas & Halsey

[57] ABSTRACT

A word driver in a decoder circuit of a semiconductor device has either a matrix of diodes or a multi-emitter transistor, each of said diodes or emitters of said multi-emitter transistor being connected between one of the decoder lines and a junction of a resistor circuit which is connected to a power source and another transistor which is connected to one of the word lines.

6 Claims, 7 Drawing Figures

DECODER CIRCUIT OF A SEMICONDUCTOR MEMORY DEVICE

BACKGROUND OF THE INVENTION

The present invention relates to a decoder circuit of a semiconductor memory device.

A fundamental decoder circuit of a semiconductor memory device is illustrated in FIG. 1A. The decoder circuit of FIG. 1A comprises address input terminals 1 ($A_0$, $A_1$, $A_2$, ...), address buffers 21, 22, 23..., decoder lines 3 ($d_0$, $\bar{d}_0$, $d_1$, $\bar{d}_1$, ... $d_n$, $\bar{d}_n$), word drivers 41, 42, 43, ... and word lines 5 ($W_0$, $W_1$, $W_2$, ...). Memory cells are connected to cross points of the word lines and bit lines, though the memory cells and the bit lines are not shown in FIG. 1A. An emitter follower connection transistor $Q_E$ is included in the address buffer. In the circuit of FIG. 1A, constant current sources $S_1$, $S_2$ and $S_3$ are provided in the address buffers, the decoder lines and the word drivers, respectively. Currents $I_1$, $I_2$ and $I_3$ pass through the constant current sources $S_1$, $S_2$ and $S_3$, respectively. Each of these constant current sources consists of, for example, one of the circuits (1), (2) and (3) illustrated in FIG. 1B. The number of the input terminals $A_0$, $A_1$, $A_2$, ... is N. The number of the address buffers 21, 22, 23, ... is also N. The number of the decoder lines $d_0$, $\bar{d}_0$, $d_1$, $\bar{d}_1$, ... is 2N. The number of the word drivers 41, 42, 43, ... and accordingly the number of the word lines $W_0$, $W_1$, $W_2$, ... is $2^N$.

Accordingly, in the circuit of FIG. 1A, the numbers of the constant current sources $S_1$, $S_2$ and $S_3$ are N, 2N and $2^N$, respectively, so that the number of the entire constant current sources is equal to "$N+2N+2^N$". The total current I' which passes through the entire constant current sources is "$I'=NI_1+2NI_2+2^N I_3$", if the constant current sources $S_1$, $S_2$ and $S_3$ consist of the circuits illustrated in FIG. 1B which are operated in the normally-on manner. Accordingly, the value of the total current I' becomes greater if the number of the input terminals N is increased.

A prior art decoder circuit of a semiconductor circuit, which avoids the above described increase of the number of the constant current sources and the value of the total current, is illustrated in FIG. 2. The decoder circuit of FIG. 2 comprises address input terminals $A_0$, $A_1$, $A_2$..., address buffers 21, 22, 23, ..., decoder lines 3($d_0$, $\bar{d}_0$, $d_1$, $\bar{d}_1$ ... $d_n$, $\bar{d}_n$), word drivers 41', 42', 43', .. and word lines $W_0$, $W_1$, $W_2$, .... In the circuit of FIG. 2, no constant current sources are provided in the decoder lines and the word drivers, and the constant current sources are provided only in the address buffers.

If the word line $W_0$ connected to the word driver 41' is selected, every one of the diodes $D_1$, $D_2$, ... connected to the decoder lines is in an OFF state, thus the transistor $Q_W$ is in an ON state, and accordingly the word line $W_0$ is in a HIGH level. On the contrary, if the word line $W_0$ connected to the word driver 41' is not selected, at least one of the diodes $D_1$, $D_2$, ... connected to the decoder lines is in an ON state, thus the transistor $Q_W$ is in an OFF state, and accordingly the word line $W_0$ is in a LOW level. A diode connected to a decoder line in a HIGH level is in an OFF state, while a diode connected to a decoder line in a LOW level is in an ON state. An input signal $A_0$ is compared with a reference signal $E_S$ in the address buffer 21. When the input signal $A_0$ is higher than the reference signal $E_S$, an output signal $\bar{A}_D$ of the address buffer is in a LOW level, so that the decoder line $\bar{d}_0$ is in a LOW level. On the contrary, when the input signal $A_0$ is lower than the reference signal $E_S$, an output signal $\bar{A}_D$ of the address buffer is in a HIGH level.

In the circuit of FIG. 2, the number of the constant current sources is only N. Assuming that the value of the current passing through the resistor $R_0$ of the word driver 41' of FIG. 2 is equal to the value of the current $I_3$ passing through the constant current source $S_3$ of the word driver 41 of FIG. 1A and that the value of the current passing through a load resistance of the address buffer 21 of FIG. 2 is negligible, the total current I'' which passes through the constant current sources is only "$I_c = NI_1 + 2(2^N - 1)I_3$". This value of the total current I'' is considerably smaller than the total current I' of the circuit of FIG. 1A.

However, in the circuit of FIG. 2, the raising of the potential of a decoder line to a HIGH level is effected by charging up the decoder line, which has a great capacitance $C_d$, through the resistor $R_l$ of the address buffer. Because of the great value of the time constant $R_l C_d$, a considerable length of time is required to build up the potential of the decoder line when a signal is applied to an address input terminal, so that the speed of response of the decoder line to the input signal is reduced.

The prior art decoder circuit of a semiconductor memory device illustrated in FIG. 2 is disclosed in, for example, the U.S. Pat. No. 3,914,620.

The present invention is proposed in order to solve the problems in the above described prior art decoder circuit of a semiconductor memory device.

DISCLOSURE OF THE INVENTION

It is the principal object of the present invention to reduce the build-up time of the potential of the decoder line being raised to a HIGH level and to realize a quick response of the decoder line to an input signal with the use of a limited number of constant current sources.

In accordance with the present invention, there is provided a decoder circuit of a semiconductor memory device, comprising: a sequence of address signal input terminals, a plurality of address buffers, each of the address buffers including a gate circuit for producing an address signal and an inverted address signal, a constant current source and an emitter follower connection transistor, a plurality of decoder lines consisting of pairs of decoder lines connected to an output of the address buffer producing an address signal and another output of the address buffer producing an inverted address signal, each pair of the decoder lines being connected to an emitter follower connection transistor of the address buffer and a constant current source, a main part of the current passing through only one decoder line of each pair of the decoder lines, a plurality of word drivers having either a matrix of diodes or a multi-emitter transistor, a resistor circuit connected to a power source and a transistor connected to a word line, each of the diodes or emitters of the multi-emitter transistor being connected between one of the decoder lines and a junction of the resistor circuit and the base of the transistor, and, a sequence of word lines.

DESCRIPTION OF THE PREFERRED EMBODIMENTS

Figure 3:
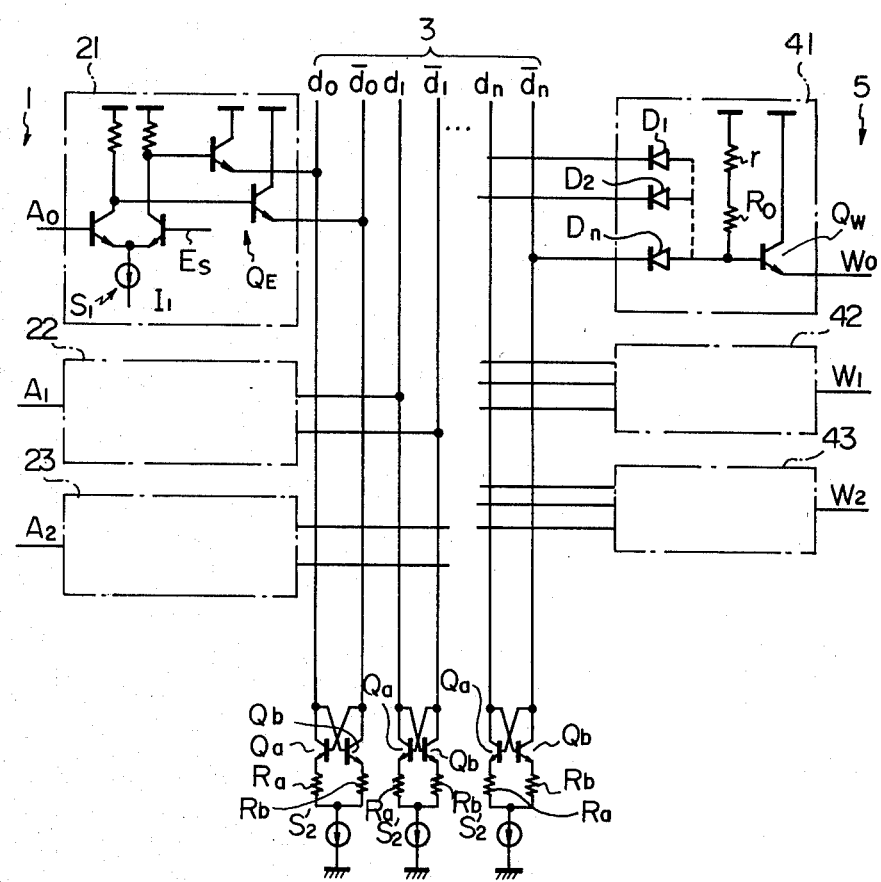
FIG. 3 illustrates a decoder circuit of a semiconductor memory device as an emodiment of the present invention.

A decoder circuit of a semiconductor memory device as an emodiment of the present invention is illustrated in FIG. 3. The decoder circuit of FIG. 3 comprises address input terminals 1 ($A_0$, $A_1$, $A_2$, ...), address buffers 21, 22, 23, ..., decoder lines 3($d_0$, $\overline{d}_0$, $d_1$, $\overline{d}_1$, ... $d_n$, $\overline{d}_n$), word drivers 41, 42, 43, ... and word lines 5($W_0$, $W_1$, $W_2$, ...). The word driver 41 includes a plurality of diodes $D_1$, $D_2$, ..., $D_n$ connected to the decoder lines. The address buffer 21 includes emitter follower connection transistors $Q_E$ connected to the decoder lines. A constant current source $S'_2$ is connected to each pair of decoder lines d and $\overline{d}$, through current switching transistors $Q_a$, $Q_b$ and resistors $R_a$, $R_b$.

Figure 2:
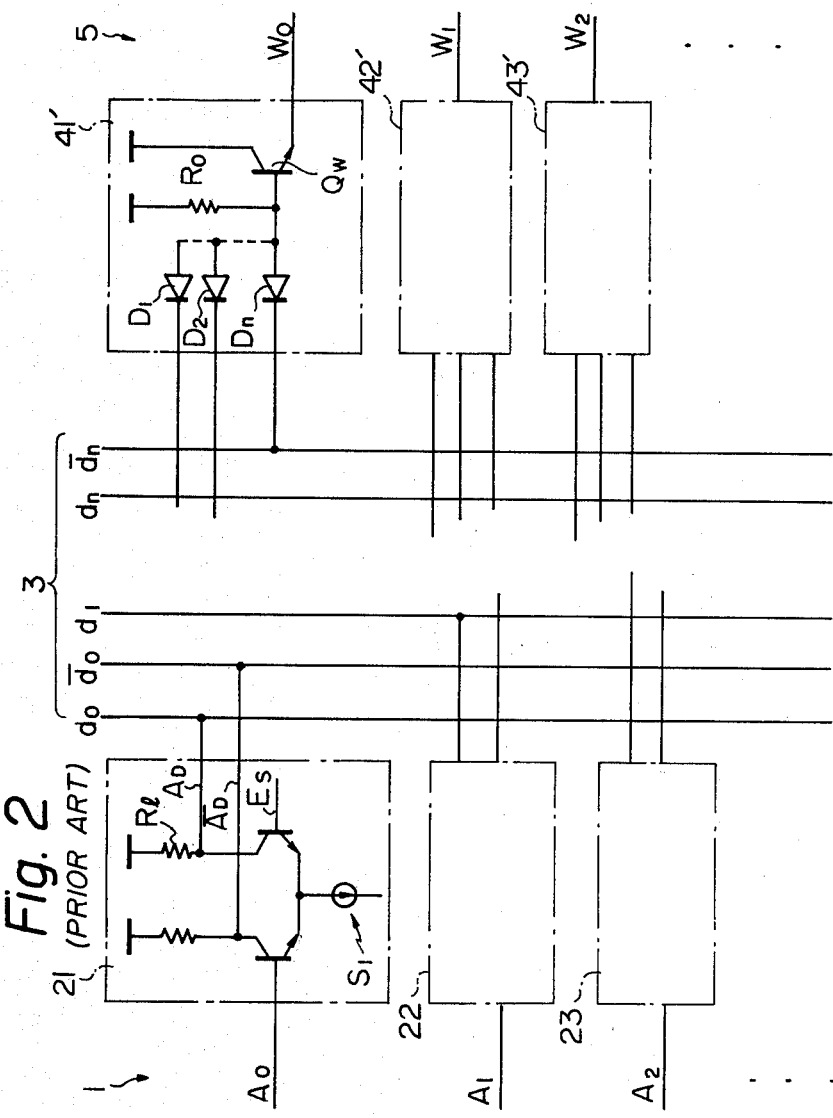
FIG. 2 illustrates a prior art decoder circuit of a semiconductor memory device.

In the circuit of FIG. 3, the raising of the potential of a decoder line of the decoder lines to a HIGH level is effected directly by the power source through the emitter follower connection transistors $Q_E$. Accordingly, a quick building up of the potential of the selected decoder line is possible. The speed of response of the decoder line to an inut signal in the circuit of FIG. 3 is greater than that in the prior art circuit of FIG. 2.

Figure 1A:
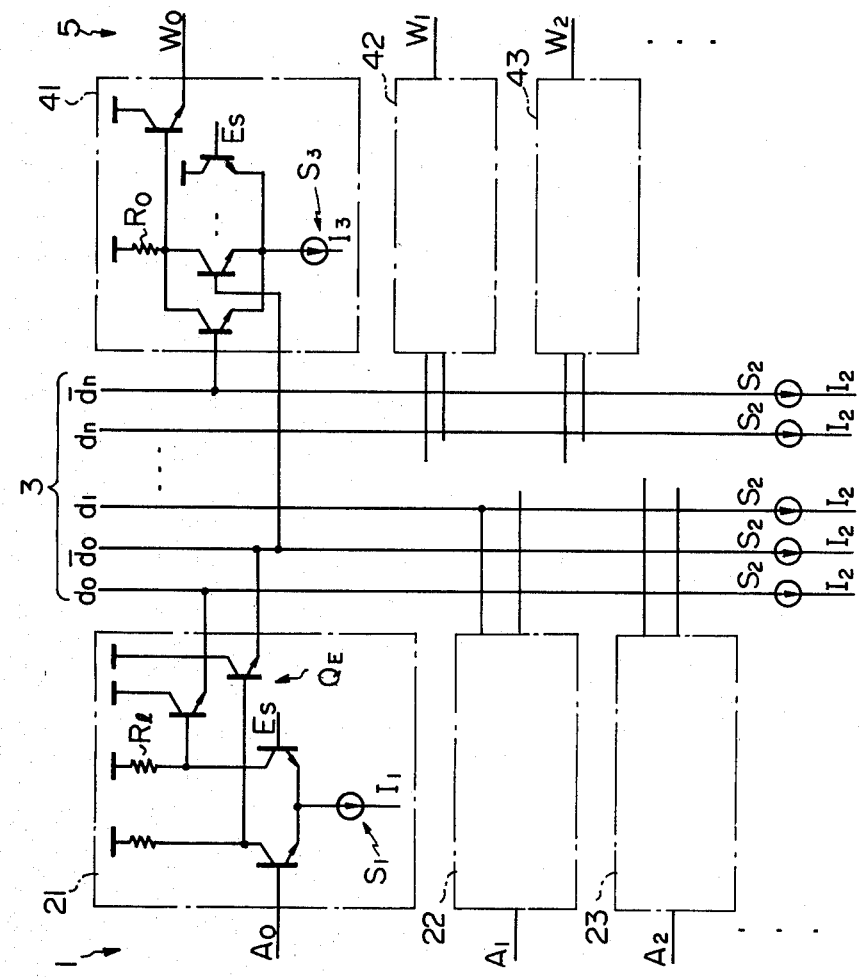
FIG. 1A illustrates a fundamental decoder circuit of a semiconductor memory device.
Figure 1B:
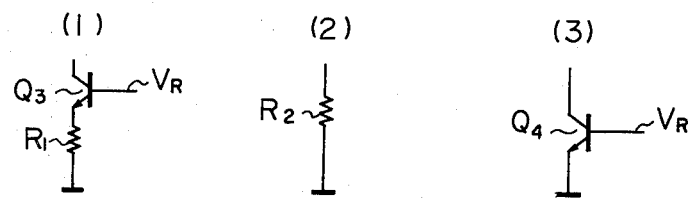
FIG. 1B illustrates examples of the circuits of the constant current sources included in the circuit of FIG. 1A.

In the circuit of FIG. 3, the number of the constant current sources is "N+N", the total current I which passes the constant current sources is "$I = NI_1 + (2^N - 1)I_3$", assuming that the value of the current passing the resistor $R_0$ is equal to the value of the current $I_3$ in the circuit of FIG. 1A.

Thus, in the circuit of FIG. 3, the operational characteristics of the decoder circuit of a semiconductor circuit is improved without providing a great number of the constant current sources and without requiring a great value of the total current of the constant current sources. Because the structure of the word driver is simplified in the circuit of FIG. 3, the size of the word driver is reduced so that the price of the decoder circuit for a semiconductor memory device is reduced.

Figure 4:
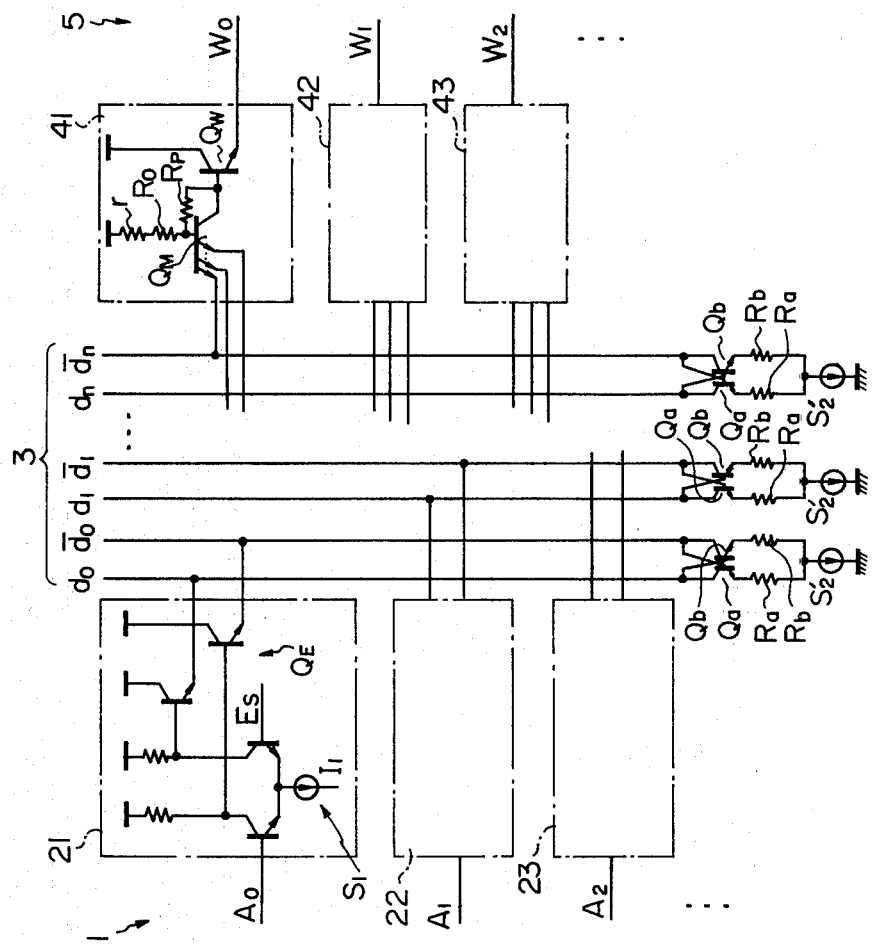
FIG. 4 illustrates a decoder circuit of a semiconductor memory device as another embodiment of the present invention.

A decoder circuit of a semiconductor memory device of another embodiment of the present invention is illustrated in FIG. 4. In the decoder circuit of FIG. 4, a multi-emitter transistor $Q_M$ is used in the word driver 41, instead of a plurality of diodes as in the word driver of FIG. 3. In the circuit of FIG. 4, the speed of building up the potential of the decoder lines is further reduced than in the circuit of FIG. 3, because the amplitude in the decoder lines is reduced.

Figure 5:
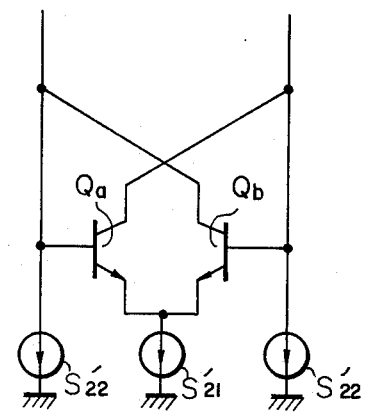
FIG. 5 illustrates a modified constant current source applicable to the circuit of FIG. 3.

A modified constant current source applicable to the circuit of FIG. 3 is illustrated in FIG. 5. In the circuit of FIG. 5, additional constant current sources $S'_{22}$ are connected to the decoder lines in addition to the current source $S'_2$ used in the circuit of FIG. 3, referred to in FIG. 5 as $S'_{21}$.

Figure 6:
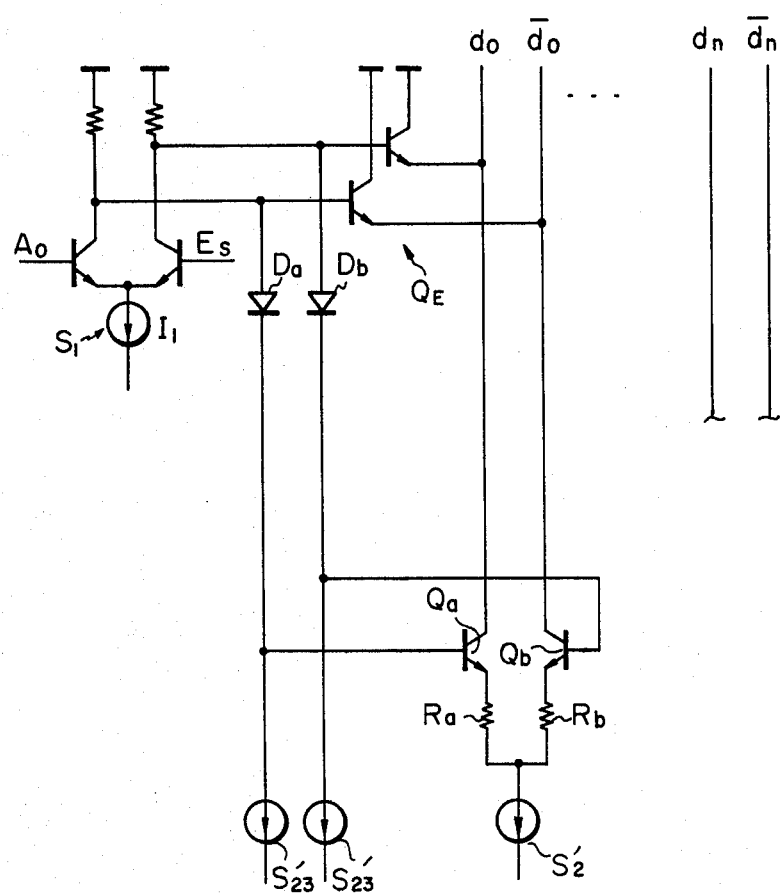
FIG. 6 illustrates a modification of the circuit of FIG. 3.

A modification of the circuit of FIG. 3 is illustrated in FIG. 6. In the circuit of FIG. 6, the signals to the bases of the switching transistors $Q_a$ and $Q_b$ are supplied from the address buffer through level shifting diodes $D_a$ and $D_b$. In the circuit of FIG. 6, it is possible to effect a quick start of the charging of the decoder lines so that the speed of the operation of the decoder circuit can be increased.

I claim:

1. A decoder circuit of a semiconductor memory device, comprising:

a sequence of address signal input terminals, a plurality of address buffers, each of said address buffers including a gate circuit for producing an address signal and an inverted address signal, a constant current source and an emitter follower connection transistor, a plurality of decoder lines consisting of pairs of decoder lines connected to an output of said address buffer producing an address signal and another output of said address buffer producing an inverted address signal, each pair of said decoder lines being connected to said emitter follower connection transistor of said address buffer and a constant current source, a main part of the current passing through only one decoder line of each pair of said decoder lines, a plurality of word drivers having a matrix of diodes, a resistor circuit connected to a power source and a transistor connected to a word line, each of said diodes being connected between one of said decoder lines and a junction of said resistor circuit and the base of said transistor, and, a sequence of word lines.

2. A decoder circuit of a semiconductor memory device, comprising:

a sequence of address signal input terminals, a plurality of address buffers, each of said address buffers including a gate circuit for producing an address signal and an inverted address signal, a constant current source and an emitter follower connection transistor, a plurality of decoder lines consisting of pairs of decoder lines connected to an output of said address buffer producing an address signal and another output of the address buffer producing an inverted address signal, each pair of said decoder lines being connected to said emitter follower connection transistor of said address buffer and a constant current source, a main part of the current passing through only one decoder line of each pair of said decoder lines, a plurality of word drivers having a multi-emitter transistor, a resistor circuit connected to a power source and a transistor connected to a word line, each of the emitters of said multi-emitter transistor being connected to one of said decoder lines, the collector of said multi-emitter transistor connected to a junction of said resistor circuit and the base of said transistor connected to a word line, and, a sequence of word lines.

3. A decoder circuit of a semiconductor memory device as defined in claim 1 or 2, wherein switching transistors, are inserted in decoder lines constituting each of said pairs of decoder lines.

4. A decoder circuit of a semiconductor memory device as defined in claim 1 or 2, further comprising additional constant current sources connected to each of said pairs of decoder lines.

5. A decoder circuit of a semiconductor memory device as defined in claim 3, further comprising circuits including level shifting diodes for supplying signals to the bases of said switching trnsistors inserted in said decoder lines.

6. A decoder circuit of a semiconductor memory device, comprising:
- a sequence of address signal input terminals,
- a plurality of address buffers, each of said address buffers including a gate circuit for producing an address signal and an inverted address signal, a constant current source and an emitter follower connection transistor,
- a plurality of decoder lines consisting of pairs of decoder lines connected to an output of said address buffer producing an address signal and another output of the address buffer producing an inverted address signal, each pair of said decoder lines being connected to said emitter follower connection transistor of said address buffer and a constant current source, a main part of the current passing through only one decoder line of each pair of said decoder lines,
- a plurality of word drivers having semiconductor means with a plurality of inputs and an output, a resistor circuit connected to a power source and a transistor connected to a word line, each input of said semiconductor means being connected to one of said decoder lines, the output of said semiconductor means connected to a junction of said resistor circuit and the base of said transistor connected to a word line, and,
- a sequence of word lines.

* * * * *

UNITED STATES PATENT AND TRADEMARK OFFICE
CERTIFICATE OF CORRECTION

PATENT NO. : 4,349,895
DATED : Sep. 14, 1982
INVENTOR(S) : Isogai

It is certified that error appears in the above-identified patent and that said Letters Patent is hereby corrected as shown below:

Column 1, line 27, "$d_0, d_0, d_1, d_1$" should be

-- $d_0, \bar{d}_0, d_1, \bar{d}_1$ --.

Column 3, line 43, "$I = NI_\ell + (2^N -$" should be

-- $I = NI_\ell + 2(2^N -$ --.

Column 5, line 8, "trnsistors" should be -- transistors --.

Signed and Sealed this

Fifteenth Day of February 1983

[SEAL]

Attest:

GERALD J. MOSSINGHOFF

Attesting Officer      Commissioner of Patents and Trademarks